US012663396B2

(12) United States Patent
Kim

(10) Patent No.: US 12,663,396 B2
(45) Date of Patent: Jun. 23, 2026

(54) METHOD FOR MANUFACTURING WORKING ELECTRODE FOR BIOSENSOR INCLUDING METAL NANOPARTICLES, ELECTRODE MANUFACTURED THEREBY, AND METHOD FOR MEASURING CONCENTRATION OF BIOMARKERS IN SAMPLE USING MANUFACTURED ELECTRODE

(71) Applicant: KOREA ELECTRONICS TECHNOLOGY INSTITUTE, Seongnam-si (KR)

(72) Inventor: Seong Eun Kim, Seoul (KR)

(73) Assignee: Korea Electronics Technology Institute, Seongnam-si (KR)

( * ) Notice: Subject to any disclaimer, the term of this patent is extended or adjusted under 35 U.S.C. 154(b) by 446 days.

(21) Appl. No.: 18/321,484

(22) Filed: May 22, 2023

(65) Prior Publication Data

US 2023/0296552 A1      Sep. 21, 2023

Related U.S. Application Data

(63) Continuation of application No. PCT/KR2021/017159, filed on Nov. 22, 2021.

(30) Foreign Application Priority Data

Nov. 24, 2020      (KR) ........................ 10-2020-0159069

(51) Int. Cl.
| | |
|---|---|
| *G01N 27/327* | (2006.01) |
| *H10P 14/20* | (2026.01) |
| *H10W 20/44* | (2026.01) |

(52) U.S. Cl.
CPC ..... *G01N 27/3276* (2013.01); *G01N 27/3277* (2013.01); *G01N 27/3278* (2013.01); *H10P 14/3461* (2026.01); *H10W 20/4432* (2026.01)

(58) Field of Classification Search
None
See application file for complete search history.

(56) References Cited

FOREIGN PATENT DOCUMENTS

| | | |
|---|---|---|
| EP | 2437048 B1 | 1/2016 |
| JP | 2011-185874 A | 9/2011 |

(Continued)

OTHER PUBLICATIONS

S.-E. Kim, et al., "A simple electrochemical immunosensor platform for detection of Apolipoprotein A1 (Apo-A1) as a bladder cancer biomarker in urine", Sensors and Actuators B: Chemical, 278: p. 103-109, Jan. 2019.*

(Continued)

*Primary Examiner* — J. Christopher Ball
(74) *Attorney, Agent, or Firm* — Knobbe, Martens, Olson & Bear, LLP

(57) ABSTRACT

A method for manufacturing a working electrode for a biosensor is proposed. The method may include providing an Indium Tin Oxide (ITO) glass electrode. The method may also include immobilizing a fixing material on the surface of the ITO glass electrode, wherein the fixing material comprises a first compound and a second compound, and wherein the second compound is a linker compound-metal nanoparticle conjugate. The method may further include immobilizing a reaction factor on the fixing material. An electrode manufactured by the method, and a method for measuring the concentration of biomarkers in a sample using a biosensor including the working electrode are also proposed.

11 Claims, 3 Drawing Sheets

(56)     References Cited

FOREIGN PATENT DOCUMENTS

KR      10-2012-0125898  A      11/2012
KR            10-1758355  B1      7/2017
KR      10-2020-0077058  A       6/2020

OTHER PUBLICATIONS

A. Bonanni, et al., "Signal amplification for impedimetric genosensing using gold-streptavidin nanoparticles", Electrochimica Acta, 53 (11): p. 4022-4029, Apr. 2008.*
International Search Report dated Feb. 23, 2022 in International Application No. PCT/KR2021/017159.

* cited by examiner

METHOD FOR MANUFACTURING WORKING ELECTRODE FOR BIOSENSOR INCLUDING METAL NANOPARTICLES, ELECTRODE MANUFACTURED THEREBY, AND METHOD FOR MEASURING CONCENTRATION OF BIOMARKERS IN SAMPLE USING MANUFACTURED ELECTRODE

CROSS REFERENCE TO RELATED APPLICATIONS

This is a continuation application of International Patent Application No. PCT/KR2021/017159, filed on Nov. 22, 2021, which claims priority to Korean Patent Application No. 10-2020-0159069 filed on Nov. 24, 2020, contents of both of which are incorporated herein by reference in their entireties.

BACKGROUND

Technical Field

The present disclosure relates to a method of manufacturing a working electrode for use in a biosensor for measuring the concentration of a biomarker for a specific disease present in a sample, an electrode manufactured by the manufacturing method, and a method of measuring the concentration of a biomarker in a sample using the same, and more particularly to a novel method of manufacturing a working electrode for a biosensor including treating the surface of an ITO (indium tin oxide) glass electrode with a conjugate of a biosupport and metal nanoparticles at the same time as surface treatment with a biomaterial, an electrode manufactured thereby, and a method of measuring the concentration of a biomarker in a sample using the same.

Description of the Related Technology

Research into disease diagnosis using urine began to receive attention in earnest with the development of a urine test strip capable of testing sugar and protein in 1958. Since then, research into systems for diagnosing more diseases using urine and test methods using the same has been conducted. When diagnosing various diseases including prostate cancer or bladder cancer using urine, it is possible to obtain samples through non-invasive methods, unlike invasive methods such as blood sampling, advantageously reducing the patient's mental and physical burden.

SUMMARY

An aspect of the present disclosure is to provide a method of manufacturing a working electrode for a biosensor based on novel working electrode surface treatment methodology capable of exhibiting superior sensitivity despite the use of the biosupport, and a working electrode manufactured thereby, and a method of measuring the concentration of a biomarker for a specific disease in a sample using a biosensor including the working electrode.

A first aspect of the present disclosure provides a method of manufacturing a working electrode for a biosensor, including providing an ITO (indium tin oxide) glass electrode, immobilizing a fixing material on the surface of the ITO glass electrode, in which the fixing material includes a first compound and a second compound and the second compound is a conjugate of a linker compound and metal nanoparticles, and immobilizing a response factor to the fixing material.

According to an embodiment of the present disclosure, the first compound and the linker compound may be compounds of the same kind.

According to an embodiment of the present disclosure, the first compound and the linker compound may be avidin.

According to an embodiment of the present disclosure, avidin may be neutravidin, natural avidin, streptavidin, CaptAvidin, or any combination thereof.

According to an embodiment of the present disclosure, the metal nanoparticles may be gold nanoparticles.

According to an embodiment of the present disclosure, the amount of the metal nanoparticles in the fixing material may be $1.20 \times 10^{-3}$ $A_{520}$ units to $6.5 \times 10^{-3}$ $A_{520}$ units.

According to an embodiment of the present disclosure, the response factor may be a response factor conjugated with a third compound, and in immobilizing the response factor, the third compound may bind to the first compound.

According to an embodiment of the present disclosure, the third compound may be biotin.

A second aspect of the present disclosure provides a working electrode for a biosensor manufactured by the method according to the first aspect of the present disclosure.

A third aspect of the present disclosure provides a method of measuring the concentration of a biomarker in a sample using a biosensor, including immersing the working electrode according to the second aspect of the present disclosure in the sample, and measuring an electrical signal in response to a redox reaction by treating the immersed working electrode with an electrical redox enzyme, immersing the treated working electrode in a solution including an electrical redox substrate, and applying a redox voltage.

According to an embodiment of the present disclosure, the electrical redox enzyme may be any one enzyme selected from the group consisting of HRP (horseradish peroxidase), ALP (alkaline phosphatase), glucose oxidase, luciferase, beta-D-galactosidase ((3-malate dehydrogenase (MDH)), and acetylcholinesterase.

According to an embodiment of the present disclosure, measuring the electrical signal may be performed using cyclic voltammetry (CV), and the electrical signal may be a maximum current value measured through cyclic voltammetry.

According to the present disclosure, a novel method of manufacturing a working electrode for a biosensor enables manufacture of a biosensor having superior sensitivity compared to conventional cases, and a surface treatment method applied to the present disclosure is relatively simple, and application thereof to a biosensor adopting a conventional ELISA (enzyme-linked immunosorbent assay) system is easy, making it possible to increase the quality of existing biosensors without much effort.

DETAILED DESCRIPTION

Figure 1:
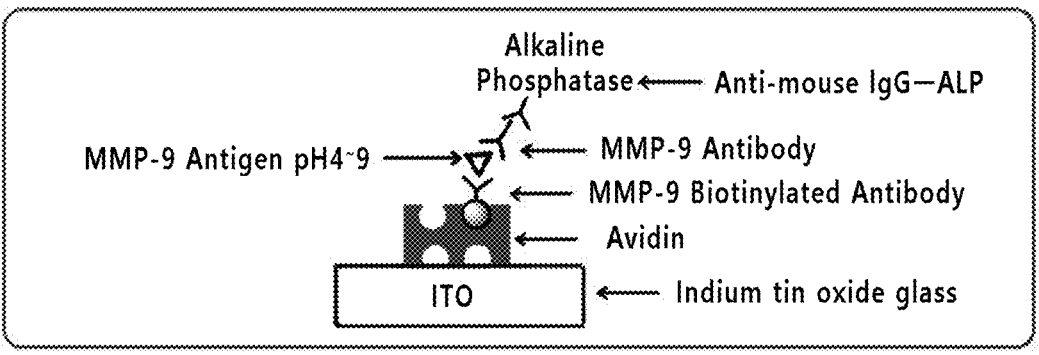
FIG. 1 schematically shows a response factor immobilized on the surface of a working electrode, a biomarker bound to the response factor, and an electrical redox enzyme used to treat the biomarker.

Unlike urine test strips that rely on visual judgment such as color change to determine the presence or absence of a disease, when the concentration of a biomarker for a disease present in urine is measured using an electrochemical sensor, it becomes possible to determine the presence or absence of a disease based on a numerical value, further increasing reliability. Accordingly, nowadays, as a biosensor capable of on-site self-diagnosis, an electrochemical sensor that measures the concentration of a biomarker for a disease present in urine from an electrochemical signal is under study, and furthermore, research into improvement in sensitivity and reliability of the biosensor is also attracting more attention.

Meanwhile, a biosensor using an electrochemical signal measurement method, such as cyclic voltammetry (CV), requires a biosupport configured to immobilize a response factor capable of reacting with and binding to a biomarker to a working electrode. The biosupport is basically a non-conductor, and there occurs a problem in that treatment of the surface of a working electrode with such a biosupport may adversely affect sensitivity of electrochemical signal measurement during sensing.

Aspects, specific advantages, and novel features of the present disclosure will become more apparent from the following detailed description and embodiments taken in conjunction with the accompanying drawings, but the present disclosure is not necessarily limited thereto. In addition, when describing the present disclosure, if it is determined that a detailed description of related known technology may unnecessarily obscure the gist of the present disclosure, the detailed description will be omitted.

Method of Manufacturing Working Electrode for Biosensor

The present disclosure pertains to a method of manufacturing a working electrode for a biosensor, including providing an ITO (indium tin oxide) glass electrode, immobilizing a fixing material on the surface of the ITO glass electrode, in which the fixing material includes a first compound and a second compound and the second compound is a conjugate of a linker compound and metal nanoparticles, and immobilizing a response factor to the fixing material.

An electrode for a biosensor according to the present disclosure is made of ITO glass. An ITO glass electrode is advantageous in that, when applied to a biosensor, noise signals may be reduced and a substrate having an ITO thin film deposited on an organic substrate may be used as is without a separate adhesive layer. The ITO glass electrode may be manufactured at very low cost because a process of manufacturing a thin film substrate having high and stable electrical conductivity may be equally utilized on a large substrate in the display industry.

A fixing material is immobilized on the surface of the ITO glass electrode. In the present disclosure, the fixing material is a material that is immobilized on the surface of the ITO glass electrode, and the fixing material may include a first compound and a second compound.

Here, the first compound corresponds to a biosupport capable of immobilizing a response factor described later. In the present disclosure, the response factor is a material capable of reacting with and binding to a biomarker present in a sample (e.g. when the biomarker is an antigen, the response factor is an antibody capable of binding to the antigen). The biosupport such as the first compound may be used to stably immobilize the response factor on the working electrode of the biosensor.

Accordingly, in the present disclosure, the first compound is not particularly limited, so long as it is able to (indirectly) immobilize the response factor on the surface of ITO glass and does not impede the purpose of the present disclosure. Illustratively, the first compound may be avidin. According to an embodiment of the present disclosure, avidin may be neutravidin, natural avidin, streptavidin, CaptAvidin, or any combination thereof.

Conventional working electrodes for biosensors are those in which a fixing material composed of the first compound alone is immobilized on the surface of the working electrode, but in the working electrode for a biosensor according to the present disclosure, the fixing material includes not only the first compound but also the second compound. By adding the composition of the second compound as described below, it becomes possible to provide a working electrode for a biosensor having superior sensitivity compared to a conventional working electrode for a biosensor. Without being bound by any particular theory, it is deemed that the presence of the nano-metallic material in the second compound greatly increases the effect of electron transfer to ITO glass.

Also, in the present disclosure, the second compound is a conjugate of a linker compound and metal nanoparticles (a linker compound-metal nanoparticle conjugate). The linker compound is not particularly limited, so long as it is able to (indirectly) immobilize the metal nanoparticles on the surface of ITO glass and does not impede the purpose of the present disclosure. Illustratively, the linker compound may be avidin. According to an embodiment of the present disclosure, avidin may be neutravidin, natural avidin, streptavidin, CaptAvidin, or any combination thereof.

In the present disclosure, the first compound and the linker compound may be compounds of the same kind, and particularly may be the same material. Accordingly, when the same material (e.g. streptavidin) is used as the first compound and the linker compound, the fixing material is immobilized on the surface of the working electrode of ITO glass, whereby streptavidin to which metal nanoparticles are not conjugated and streptavidin to which metal nanoparticles are conjugated are randomly immobilized on the surface of the ITO glass electrode.

In the metal nanoparticles according to the present disclosure, the metal may be gold, silver, nickel, platinum, copper, aluminum, an alloy of two or more thereof, or any combination thereof. In an embodiment of the present disclosure, the metal may be gold.

The metal nanoparticles may have a particle diameter ranging from about 1 nm to about 100 nm. Also, the amount of the metal nanoparticles on the surface of the working electrode of the present disclosure is about $1.20 \times 10^{-3}$ $A_{520}$ units to $6.5 \times 10^{-3}$ $A_{520}$ units, particularly $1.25 \times 10^{-3}$ $A_{520}$ units to $6.25 \times 10^{-3}$ $A_{520}$ units. If the amount of the metal nanoparticles on the surface of the electrode is less than the above lower limit, it may be difficult to achieve an effect of increasing the sensitivity due to addition of the metal nanoparticles, whereas if the amount thereof exceeds the above upper limit, the density of the metal nanoparticles may be very high compared to the response factor reacting with the biomarker on the surface of the working electrode, which may cause a problem of deteriorating sensitivity.

Immobilizing the fixing material on the surface of the ITO glass electrode is not particularly limited, and may be performed through a known technique. For example, the first compound and the second compound may be mixed so that the surface of ITO glass is treated with both simultaneously.

In the manufacturing method according to the present disclosure, the response factor is immobilized to the fixing material. More specifically, the response factor may be immobilized to the first compound of the fixing material. According to an embodiment of the present disclosure, the response factor may be a response factor that is conjugated with a third compound. The third compound is a material that reacts with and binds to the first compound, and may vary depending on the first compound. For example, when the first compound is avidin, the third compound may be biotin. When the third compound binds to the first compound, the response factor may be immobilized to the fixing material.

According to another embodiment of the present disclosure, in the manufacturing method, immobilizing the response factor to the fixing material may be performed before immobilizing the fixing material on the surface of the ITO glass electrode. Specifically, the response factor may be immobilized to the first compound through binding of the first compound and the third compound conjugated with the response factor, after which a fixing material including the first compound to which the response factor is immobilized and the second compound may be immobilized on the surface of the ITO glass electrode.

Working Electrode for Biosensor

The present disclosure pertains to a working electrode for a biosensor manufactured by the method described above. The working electrode for the biosensor includes an ITO glass electrode, a fixing material including a first compound and a second compound immobilized on the surface of the electrode, and a response factor immobilized to the fixing material.

Method of Measuring Concentration of Biomarker in Sample Using Biosensor Including Working Electrode According to the Present Disclosure The present disclosure pertains to a method of measuring the concentration of a biomarker in a sample using a biosensor, including immersing the working electrode according to an embodiment of the present disclosure in the sample, and measuring an electrical signal in response to a redox reaction by treating the immersed working electrode with an electrical redox enzyme, immersing the treated working electrode in a solution including an electrical redox substrate, and applying a redox voltage.

A sample used for measurement in the present disclosure may be a bodily fluid obtained from an animal. More specifically, the sample may be a bodily fluid obtained from a human body. Here, examples of the bodily fluid may include, but are not limited to, blood, urine, saliva, and the like, and any bodily fluid may be used so long as a target material to be analyzed is present in the bodily fluid. In an embodiment of the present disclosure, the sample may be urine.

In the present disclosure, the biomarker may be an antigen, antibody, vitamin, protein, immune molecule, DNA, or RNA. The biomarker may generally be a material incapable of oxidation or reduction reaction by itself. In order to determine the presence or absence of such a biomarker, the use of an electrical redox enzyme and substrate is considered.

In the present disclosure, the biomarker may be particularly an antigen. As such, the response factor of the working electrode has to be an antibody capable of reacting with the antigen. In an embodiment of the present disclosure, the biomarker may be a biomarker for prostate cancer or bladder cancer diagnosis, and an antigen therefor may be any one selected from the group consisting of matrix metallopeptidase-9 (MMP-9), apolipoprotein A-1 (ApoA1), prostate-specific antigen (PSA), prostate specific membrane antigen (PSMA), annexin A3 (ANX A3), nuclear matrix protein 22 (NMP22), bladder tumor antigen (BTA), and urinary bladder carcinoma antigen (UBC). Most particularly, the antigen may be MMP-9.

With reference to FIG. 1, a method of measuring the concentration of a biomarker in urine using MMP-9 as the biomarker is illustrated. In the measurement method according to the present disclosure, a biosensor including the working electrode according to an embodiment of the present disclosure is prepared. As shown in FIG. 1, a response factor (MMP-9 antibody) conjugated with a third compound (biotin) is indirectly immobilized by a first compound (avidin) on the surface of the working electrode of ITO glass. When avidin and biotin are used as the first compound and the third compound, respectively, it is easy to control directionality to represent a surface area of the binding site of the enzyme to be immobilized, so that the surface area of the binding site of the enzyme may be maximally represented by appropriate directional control of the enzyme on the surface, thereby maximizing the ability to detect a target material in the sample.

Thereafter, the working electrode is immersed in urine obtained from a patient. By immersing the working electrode in urine, the biomarker (MMP-9 antigen) for a specific disease present in urine and the response factor (antibody) immobilized on the surface of the working electrode bind to each other through reaction (antigen-antibody reaction).

After immersion of the working electrode in urine, the immersed working electrode is treated with an electrical redox enzyme. Thereafter, the treated working electrode is immersed in a solution including an electrical redox substrate and a redox voltage is applied to measure an electrical signal in response to the redox reaction. In the present disclosure, the electrical redox enzyme is a material that activates the electrical redox substrate to enable redox reaction. Moreover, in the present disclosure, the electrical redox substrate is a material that, when a voltage is applied through the working electrode after being activated, is subjected to redox reaction by the applied voltage to absorb or release electrons, thereby generating a current.

FIG. 1 shows an example in which ALP (alkaline phosphatase) is used as the electrical redox enzyme and AAP (ascorbic acid-2-phosphate) is used as the electrical redox substrate. Here, AAP is converted into AA (ascorbic acid) as an enzymatic reaction product by separating the phosphate functional group by ALP. AA is oxidized to dehydroascorbate by an oxidation voltage applied through the working electrode. An electrical signal generated during oxidation reaction, for example, a current value, may be measured, and the concentration of the desired target material in the sample may be calculated therefrom.

The electrical redox enzyme may be used to treat the working electrode immersed in urine and may bind to the biomarker as shown in FIG. 1. Here, the treatment with the enzyme is not particularly limited, so long as it allows the enzyme to uniformly bind to the biomarker bound to the response factor immobilized on the surface of the working electrode. For example, the enzyme may bind to the biomarker through a known method such as spraying, immersion, soaking, or the like.

Since the enzyme has substrate specificity, in the present disclosure, the biomarker and the enzyme may directly or indirectly bind to each other. Upon indirect binding, a secondary antibody that is different from the response factor (so-called primary antibody) immobilized on the surface of the working electrode and is capable of binding to the biomarker (antigen), and an electrical redox enzyme-linked antibody to which an electrical redox enzyme is attached, binding to the secondary antibody, may be used.

For example, referring to FIG. 1 again, an MMP-9 antibody different from an MMP-9 biotinylated antibody (primary antibody) is used as the secondary antibody, and ALP-attached anti-mouse IgG is used as the electrical redox enzyme-linked antibody capable of binding to the secondary antibody.

Since the redox reaction of the electrical redox substrate is carried out only when the electrical redox enzyme binds to the antigen bound to the antibody immobilized on the working electrode, the electrical signal measured through the electrical redox reaction depends on the concentration of the antigen in urine, and thus it is possible to inversely calculate the concentration of the antigen in urine from the electrical signal.

In the present disclosure, examples of the electrical redox enzyme may include ALP, HRP (horseradish peroxidase), glucose oxidase, luciferase, beta-D-galactosidase ($\beta$-malate dehydrogenase (MDH)), acetylcholinesterase, and the like. Most particularly, the enzyme may be ALP or HRP. ALP and HRP have the advantage of having very sensitive reactivity, and in particular, HRP is advantageous in view of cost because it is inexpensive. Also, ALP is advantageous because of a long signal retention time of about 24 to 48 hours.

For the electrical redox substrate according to the present disclosure, a substrate corresponding to the electrical redox enzyme is used, as with AAP activated by ALP.

In measurement of the electrical signal, a known electrochemical measurement method may be used. According to an embodiment of the present disclosure, cyclic voltammetry (CV) may be used. Cyclic voltammetry is a method of measuring current by circulating a voltage applied to a working electrode at a constant speed, whereby a cyclic voltammetry curve may be obtained. Here, the electrical signal measured through cyclic voltammetry indicates the maximum current value represented in the cyclic voltammetry curve. The concentration of the antigen in urine may be determined by measuring the current value at a specific voltage, for example, at a voltage of 0.34 V, as disclosed in the related patent application KR 10-2017-0154148 using ALP as an electrical redox enzyme, namely measuring the extent of redox reaction of the electrical redox substrate by the electrical redox enzyme bound to the biomarker.

A better understanding of the present disclosure may be obtained through the following examples, but these examples are merely set forth to illustrate the present disclosure and are not to be construed as limiting the present disclosure.

EXAMPLES

Figure 2:
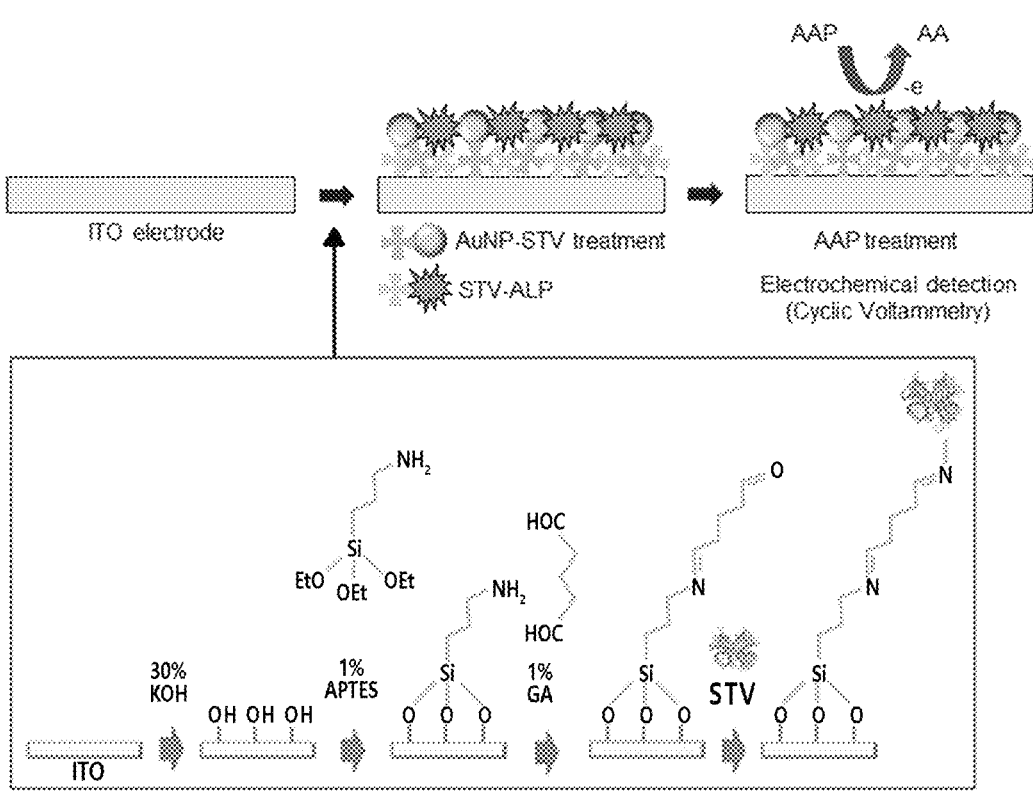
FIG. 2 schematically shows a process of manufacturing a working electrode according to an embodiment of the present disclosure.

Preparation Example 1. Manufacture of Working Electrode Including High-Concentration AuNP The surface of an ITO electrode (24 mm$^2$) was sonicated with 10 mL of each of a trichlorethylene solution, an ethanol solution, and DI water for 15 minutes, after which the electrode was immersed in a 30% KOH solution for 10 minutes and then washed with DI water, and ultimately OH groups were activated on the surface of the electrode. Thereafter, the working electrode was treated with (3-aminopropyl)triethoxysilane (APTES) and glutaraldehyde (GA) and allowed to react at room temperature for about 2 hours with a mixture of 15 µl of 100 µg/ml streptavidin-ALP and 15 µl of a streptavidin-10 nm gold ($6.25 \times 10^{-3}$ A$_{520}$ units) conjugate. Streptavidin and the conjugate were chemically adsorbed onto the ITO electrode surface through covalent bonding. FIG. 2 schematically shows the process of manufacturing the working electrode.

Preparation Example 2. Manufacture of Working Electrode Including Low-Concentration AuNP A working electrode was manufactured in the same manner as in Preparation Example 1, with the exception that the working electrode was allowed to react with a mixture of 15 µl of 100 µg/ml streptavidin-ALP and 15 µl of a streptavidin-10 nm gold ($1.25 \times 10^{-3}$ A$_{520}$ units) conjugate, rather than the mixture of 15 µl of 100 µg/ml streptavidin-ALP and 15 µl of the streptavidin-10 nm gold ($6.25 \times 10^{-3}$ A$_{520}$ units) conjugate.

Comparative Preparation Example 1. Manufacture of Working Electrode not Including AuNP A working electrode was manufactured in the same manner as in Preparation Example 1, with the exception that the working electrode was allowed to react with 15 µl of 100 µg/ml streptavidin, rather than the mixture of 15 µl of 100 µg/ml streptavidin-ALP and 15 µl of the streptavidin-10 nm gold conjugate.

Figure 3A:
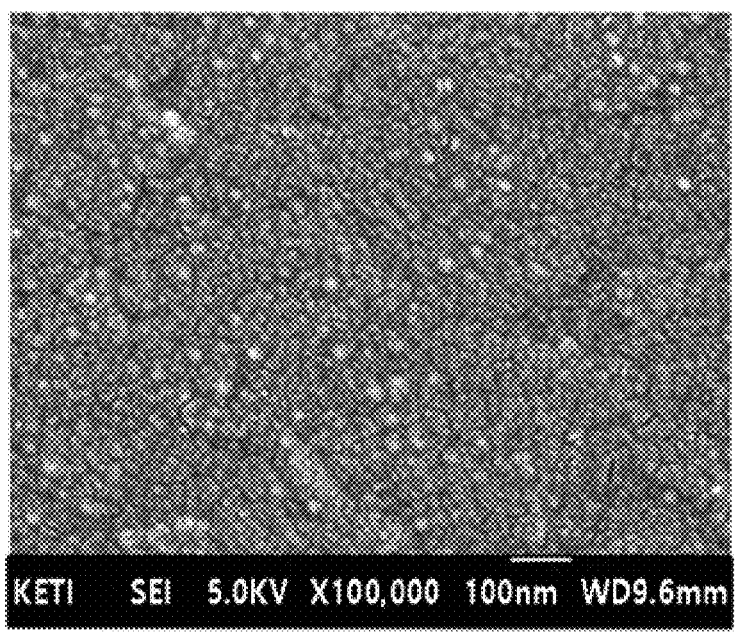
FIG. 3A, FIG. 3B, and FIG. 3C show SEM images of the surfaces of working electrodes of Preparation Examples 1 and 2 and Comparative Preparation Example 1 according to the present disclosure.
Figure 3B:
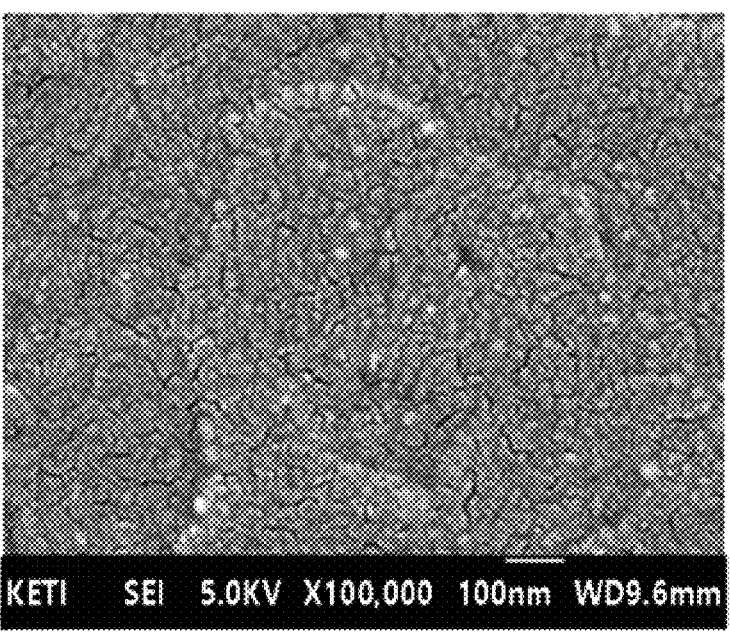
Figure 3C:
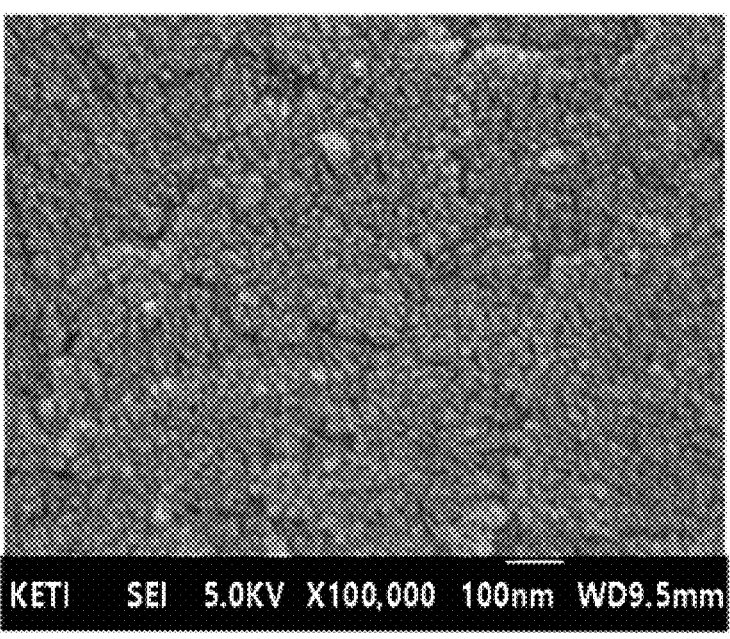

SEMs of the surfaces of the working electrodes of Preparation Examples 1 and 2 and Comparative Preparation Example 1 are shown in FIG. 3A, FIG. 3B, and FIG. 3C, respectively.

Experiment 1. Analysis of Electrochemical Signal Intensity Depending on AuNP Concentration Electrochemical signal intensity was analyzed using a biosensor including the working electrode manufactured in each of Preparation Example 1, Preparation Example 2, Comparative Preparation Example 1, and Comparative Preparation Example 1 without reaction of 15 µl of biotin-attached ALP at 4° C. for about 30 minutes.

Each electrode was immersed in a sample at 15° C. including ascorbic acid-2-phosphate (AAP). After immersion, the value of current versus voltage was measured using cyclic voltammetry. The voltage was cycled between 0 and 0.9 V.

Figure 4:
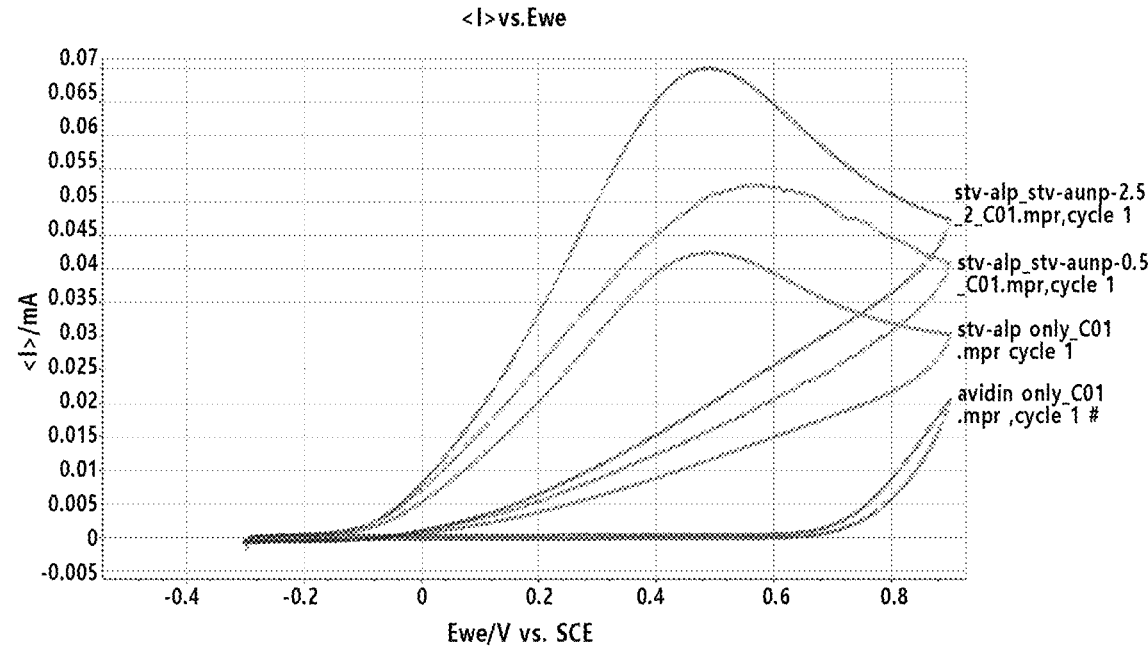
FIG. 4 is a graph showing results of measurement of electrochemical signals according to an experimental example of the present disclosure.

The results thereof are graphed in FIG. 4. The blue curve is for the working electrode without ALP treatment, the red curve is for the working electrode without AuNP treatment, the green curve is for the working electrode with low-concentration AuNP treatment, and the purple curve is for the working electrode with high-concentration AuNP treatment.

As shown in FIG. 4, the electrical signal intensity was increased by about 20% or more upon treatment with AuNP compared to upon treatment without AuNP, and especially, was increased by about 60% or more upon treatment with high-concentration AuNP.

Based on the above results, it is expected that it will be possible to manufacture an electrochemical biosensor having excellent sensitivity by applying the manufacturing method according to the present disclosure to a conventional working electrode.

Simple modifications or variations of the present disclosure fall within the scope of the present disclosure as defined in the accompanying claims.

What is claimed is:

1. A method of manufacturing a working electrode for a biosensor, comprising:

providing an ITO (indium tin oxide) glass electrode;

immobilizing a fixing material on a surface of the ITO glass electrode, wherein the fixing material comprises a first compound and a second compound, and wherein the second compound is a conjugate of a linker compound and metal nanoparticles; and immobilizing a response factor to the fixing material, wherein an amount of the metal nanoparticles in the fixing material is $1.20 \times 10^{-3}$ $A_{520}$ units to $6.5 \times 10^{-3}$ $A_{520}$ units.

2. The method according to claim 1, wherein the first compound and the linker compound are compounds of same kind.

3. The method according to claim 1, wherein the first compound and the linker compound are avidin.

4. The method according to claim 3, wherein the avidin is natural avidin, streptavidin, or any combination thereof.

5. The method according to claim 1, wherein the metal nanoparticles are gold nanoparticles.

6. The method according to claim 1, wherein the response factor is a response factor conjugated with a third compound, and wherein the third compound binds to the first compound when the response factor is immobilized to the fixing material.

7. The method according to claim 6, wherein the third compound is biotin.

8. A working electrode for a biosensor manufactured by the method according to claim 1.

9. A method of measuring a concentration of a biomarker in a sample using a biosensor, comprising:

immersing the working electrode of claim 8 in the sample; and measuring an electrical signal in response to a redox reaction by treating the immersed working electrode with an electrical redox enzyme, immersing the treated working electrode in a solution comprising an electrical redox substrate, and applying a redox voltage.

10. The method according to claim 9, wherein the electrical redox enzyme is any one enzyme selected from the group consisting of HRP (horseradish peroxidase), ALP (alkaline phosphatase), glucose oxidase, luciferase, beta-D-galactosidase ($\beta$-malate dehydrogenase (MDH)), and acetylcholinesterase.

11. The method according to claim 9, wherein measuring the electrical signal is performed using cyclic voltammetry (CV), and the electrical signal is a maximum current value measured through cyclic voltammetry.

* * * * *